United States Patent
Budraa

(10) Patent No.: US 8,714,225 B2
(45) Date of Patent: May 6, 2014

(54) SYSTEMS AND METHODS FOR BONDING USING MICROWAVE ENERGY

(76) Inventor: Nasser K. Budraa, La Crescenta, CA (US)

( * ) Notice: Subject to any disclaimer, the term of this patent is extended or adjusted under 35 U.S.C. 154(b) by 0 days.

(21) Appl. No.: 13/371,384

(22) Filed: Feb. 10, 2012

(65) Prior Publication Data

US 2012/0138220 A1    Jun. 7, 2012

Related U.S. Application Data

(63) Continuation of application No. PCT/US2010/045278, filed on Aug. 12, 2010.

(60) Provisional application No. 61/233,949, filed on Aug. 14, 2009.

(51) Int. Cl.
*B29C 65/14*    (2006.01)

(52) U.S. Cl.
USPC ............ 156/379.6; 156/272.2; 156/381; 156/580; 219/678

(58) Field of Classification Search
USPC ............ 156/272.2, 349, 379.6, 381, 580; 219/678
See application file for complete search history.

(56) References Cited

U.S. PATENT DOCUMENTS

| | | | |
|---|---|---|---|
| 6,468,098 B1 * | 10/2002 | Eldridge | 439/197 |
| 6,780,759 B2 | 8/2004 | Farrens et al. | |
| 6,951,798 B2 | 10/2005 | Booske et al. | |
| 7,037,804 B2 * | 5/2006 | Kellar et al. | 438/455 |
| 2003/0000638 A1 * | 1/2003 | Booske et al. | 156/272.2 |
| 2004/0011783 A1 * | 1/2004 | Barmatz et al. | 219/678 |
| 2007/0087527 A1 | 4/2007 | Thallner | |
| 2007/0111471 A1 | 5/2007 | Okada | |
| 2007/0270062 A1 * | 11/2007 | Weber | 442/65 |
| 2008/0081485 A1 | 4/2008 | Papanu et al. | |

OTHER PUBLICATIONS

International Search Report for PCT/US2010/045278, filed Aug. 12, 2010.

* cited by examiner

*Primary Examiner* — Richard Crispino
*Assistant Examiner* — Elizabeth Royston

(57) ABSTRACT

Disclosed are systems and methods for bonding wafers by use of microwave energy. Various components that facilitate relatively quick and efficient bonding provided by microwave energy are disclosed. In certain embodiments, devices and methods for applying desirable compression to the wafers can be implemented. In certain embodiments, devices and methods for providing a controlled gas environment such as vacuum can be implemented. In certain embodiments, devices and methods for maintaining the integrity of microwave mode of operation during the bonding process can be implemented. In certain embodiments, devices and methods for increasing throughput of the bonding process can be implemented.

15 Claims, 13 Drawing Sheets

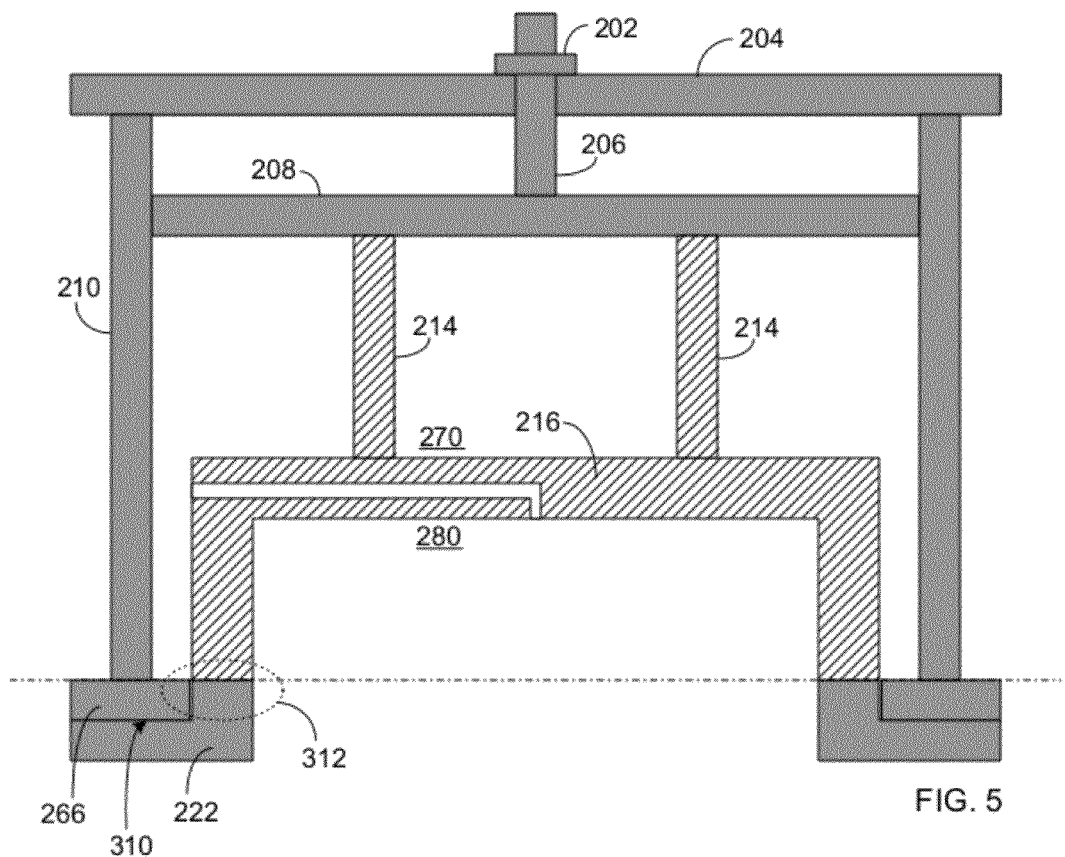
FIG. 5
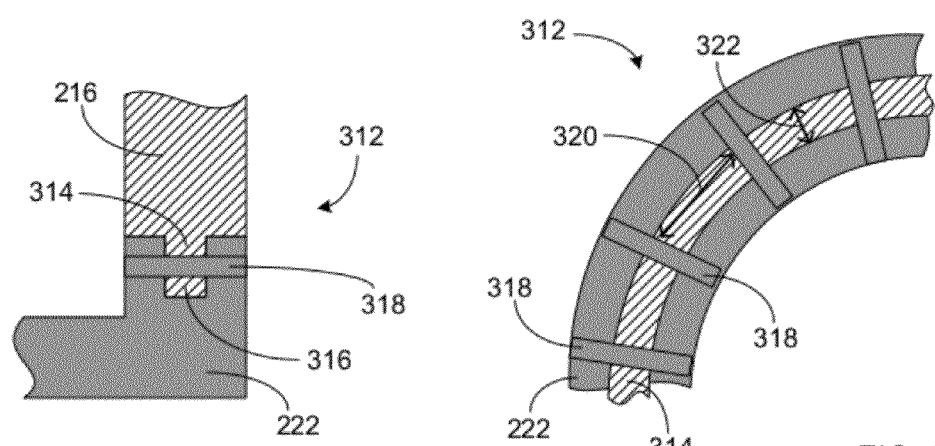
FIG. 6A
FIG. 6B

SYSTEMS AND METHODS FOR BONDING USING MICROWAVE ENERGY

RELATED APPLICATIONS

This application is a continuation of International Application No. PCT/US2010/045278, filed Aug. 12, 2010, which claims priority to and the benefit of the filing date of U.S. Provisional Patent Application No. 61/233,949, filed Aug. 14, 2009, the benefits of the filing dates of which are hereby claimed and the specifications of which are incorporated herein by this reference.

BACKGROUND

1. Field

The present disclosure generally relates to the field of semiconductor technology, and more particularly, to systems and methods for bonding semiconductor wafers using microwave energy.

2. Description of the Related Art

Application of microwave energy can quickly and effectively bond two semiconductor wafers by localized heating of a metal interlayer between the two wafers. Such localized heating can result from differences in loss tangent values and specific heat capacities.

For such microwave-based bonding process, there are a number of concerns and requirements for obtaining high quality bonds and maintaining the integrity of the semiconductor wafers. For example, compressing the wafers in certain manner can yield a more uniform bonding interface with little or no voids or trapped air pockets. In another example, maintaining certain gaseous condition during the bonding process can reduce the likelihood of oxidation of the wafers. In yet another example, efficient use of the input microwave energy is also desirable.

SUMMARY

In certain embodiments, the present disclosure relates to a microwave bonding apparatus that includes a cavity housing having a plurality of inner metal surfaces that define a microwave cavity configured to receive microwave energy in a mode of operation. The apparatus further includes a pressure housing coupled to a part of a base surface so as to be positioned substantially within the microwave cavity, with the base surface being one of the plurality of inner metal surfaces. The apparatus further includes a membrane coupled to a part of the base surface and positioned substantially within the microwave cavity and between the pressure housing and base surface. The membrane has first and second surfaces such that the pressure housing and the first surface of the membrane define a first volume that can be pressurized to deform the membrane. The apparatus further includes a sample holder having a metal surface dimensioned to receive a stack that includes two or more wafers being bonded and position the stack substantially within the microwave cavity, with the metal surface being a part of the base surface when the sample holder is installed such that the stack is between the second surface of the membrane and the base surface. The stack is dimensioned so as to allow the stack to be compressed between the second surface and the metal surface when the membrane deforms due to the pressurization of the first volume.

In certain embodiments, the cavity housing is formed substantially from metal. In certain embodiments, the pressure housing and the membrane are formed substantially from low loss-tangent materials so as to substantially maintain the microwave mode of operation in the microwave cavity. Such low loss-tangent materials can include polytetrafluoroethylene (PTFE).

In certain embodiments, the membrane is coupled to the base surface by a support wall that supports the membrane's circumference, with the support wall being dimensioned to receive the stack. In certain embodiments, the support wall and the membrane are formed as an integral piece from same material.

In certain embodiments, the apparatus further includes one or more pressure coupling devices and features configured to allow pressurization of the first volume. In certain embodiments, the one or more coupling devices and features include a pressure conduit formed within the pressure housing so as to be in communication with the first volume.

In certain embodiments, the apparatus further includes one or more gas control devices and features configured to provide a controlled gas environment to a second volume defined by the second surface of the membrane and the metal surface of the sample holder. In certain embodiments, the one or more gas control devices and features include a gas conduit formed within the sample holder so as to be in communication with the second volume. In certain embodiments, the controlled gas environment includes a vacuum environment to reduce oxidation during bonding of the wafers.

In certain embodiments, net gaseous volume of the second volume can be less than approximately 25%, 10%, 5%, 1%, or 0.1% of net gaseous volume of the microwave cavity, thereby eliminating a need to control a relatively large volume associated with the microwave cavity. In certain embodiments, net gaseous volume of the first volume can be less than approximately 25%, 10%, 5%, 1%, or 0.1% of net gaseous volume of the microwave cavity, thereby eliminating a need to pressurize a relatively large volume associated with the microwave cavity.

In certain embodiments, the apparatus further includes one or more support rods that engage the pressure housing and inhibit movement of the pressure housing relative to the base surface when the first volume is pressurized. In certain embodiments, the one or more support rods are formed from polytetrafluoroethylene.

In certain embodiments, the pressure housing is coupled to the base surface by a tongue and groove coupling, with the tongue formed on the pressure housing and the groove formed on the base surface. In certain embodiments, the tongue and groove coupling further includes a plurality of dowels that extend laterally through the tongue and walls of the groove. The plurality of dowels can be distributed circumferentially so as to inhibit movement of the pressure housing relative to the base surface when the first volume is pressurized.

In certain embodiments, the microwave mode of operation includes a single-mode operation.

In certain embodiments, the present disclosure relates to an apparatus for holding wafers during a microwave bonding process. The apparatus includes a base plate having a base surface. The apparatus further includes a membrane plate having inner and outer surfaces, with the membrane plate disposed relative to the base plate so as to define an inner volume between the inner surface and base surface. The inner surface is separated from the base surface by a selected distance sufficient to position therebetween a stack that includes two or more wafers to be bonded. The apparatus further includes a support structure that mechanically couples edges of the membrane plate and base plate so as to provide the selected distance separation between the inner surface and base surface. The membrane plate is dimensioned to deform under pneumatic pressure applied to the outer surface of the membrane plate, with the deformation resulting in the inner surface moving closer to the base surface to thereby press the stack and the two or more wafers therein.

In certain embodiments, the pneumatic pressure is supplied by a pressurized volume defined in part by the outer surface of the membrane plate.

In certain embodiments, the stack includes one or more plates formed from a low loss tangent material. In certain embodiments, the one or more low loss tangent plates include one or more polytetrafluoroethylene plates. In certain embodiments, the one or more low loss tangent plates include one or more quartz plates.

In certain embodiments, the stack includes a first polytetrafluoroethylene plate, a first quartz plate on the first polytetrafluoroethylene plate, an assembly of two or more wafers on the first quartz plate, a second quartz plate on the assembly of two or more wafers, and a second polytetrafluoroethylene plate on the second quartz plate. In certain embodiments, the first polytetrafluoroethylene plate defines an aperture that allows passage of infrared radiation from the assembly of wafers to allow monitoring of temperature during the microwave bonding process.

In certain embodiments, the assembly of two or more wafers includes first and second semiconductor wafers with a metal interlayer therebetween. In certain embodiments, the assembly of two or more wafers includes more than two semiconductor wafers with a metal interlayer between each pair of neighboring wafers. In certain embodiments, the assembly of two or more wafers includes two or more of semiconductor wafer-metal interlayer-semiconductor wafer assemblies stacked together.

In certain embodiments, thicknesses of the one or more low loss tangent plates are selected so as to accommodate the two or more wafers and any metal interlayer therebetween, such that overall thickness of the stack allows positioning of the stack between the inner surface and base surface and the pressing by the membrane deformation. In certain embodiments, the thicknesses of the one or more low loss tangent plates are selected so as to maintain a substantially constant overall thickness of the stack.

In certain embodiments, the one or more low loss tangent plates include a first plate disposed on one side of the two or more wafers and a second plate disposed on the other side of the two or more wafers. In certain embodiments, each of the first and second plates defines one or more recesses to accommodate one or more clips holding the two or more wafers in substantial alignment.

In certain embodiments, the present disclosure relates to a method for bonding two or more wafers by microwave energy. The method includes providing a deformable membrane and a support for the membrane so as to define a recess. The method further includes providing a base dimensioned to be received by the recess so as to define an inner volume between the membrane and base, with the inner volume being dimensioned to receive two or more wafers to be bonded. The method further includes coupling the membrane support and the base so as to position the two or more wafers proximate to and generally parallel to a wall of a microwave cavity. The method further includes providing a controlled gas environment for the two or more wafers during the microwave bonding process.

In certain embodiments, the controlled gas environment includes a vacuum environment.

In certain embodiments, the method further includes deforming the membrane by pneumatic pressure such that the deforming membrane compresses the two or more wafers during the microwave bonding process. In certain embodiments, the pneumatic pressure is achieved by gas pressure introduced to a volume defined on the outside of the membrane. In certain embodiments, the outside volume is defined by the membrane and a pressure housing.

In certain embodiments, the coupling includes providing a plurality of removable securing rods that extend laterally to secure the membrane support to the base.

In certain embodiments, the present disclosure relates to a method for compressing wafers during a microwave bonding process. The method includes providing a first volume one side of a deformable membrane and a second volume on the other side of the membrane. The method further includes positioning a stack in the first volume, with the stack including two or more wafers to be bonded via one or more interlayers between therebetween. The method further includes applying pneumatic pressure to the second volume so as to deform the membrane into the first volume and engage one side of the stack to thereby compress the two or more wafers.

In certain embodiments, the membrane is deformed in an elastic region. In certain embodiments, the one or more interlayers include at least one metal layer.

In certain embodiments, each of the first and second volumes is located substantially within a microwave cavity. In certain embodiments, the first volume is substantially sealed from the microwave cavity. In certain embodiments, the first volume is under substantial vacuum so as to reduce oxidation to the two or more wafers during the microwave bonding process.

In certain embodiments, the second volume is defined by the membrane and a pressure housing that substantially seals the second volume from the microwave cavity.

In certain embodiments, the present disclosure relates to a microwave bonding apparatus that includes a metal housing having a metal side wall and a movable metal cap having an inner surface. The apparatus further includes a plurality of removable components formed from one or more low loss tangent materials, where each of the removable components is supported by a metal base such that an assembly of the metal bases defines a base surface that is opposite from the inner surface of the metal cap. The base surface in combination with the metal cap and metal side wall define a microwave cavity for supporting a desired mode of operation. Each of the metal bases is movable relative to a neighboring metal base or the metal side wall due to at least some non-metal gap therebetween. At least some of the non-metal gaps are dimensioned so as to reduce leakage of microwave radiation from the microwave cavity.

In certain embodiments, the non-metal gaps are dimensioned to have a depth that is a multiple of half-wavelength of the microwave radiation.

BRIEF DESCRIPTION OF THE DRAWINGS

FIG. 5 shows an example of a pressure housing that can be incorporated as a part of the bonding system;

FIGS. 6A and 6B shows side and plan views of an example interface that can couple the pressure housing to its base;

These and other aspects, advantages, and novel features of the present teachings will become apparent upon reading the following detailed description and upon reference to the accompanying drawings. In the drawings, similar elements have similar reference numerals.

DETAILED DESCRIPTION OF CERTAIN EMBODIMENTS

The present disclosure generally relates to semiconductor technology, and more particularly, to systems and methods for bonding two or more substrates using microwave energy. Two layers of substrates such as semiconductor wafers can be bonded by localized heating of a high loss-tangent interlayer (e.g., metal layer) via application of microwave energy. For the purpose of description herein, one or more interlayers are sometimes depicted or described as being formed from metal. It will be understood, however, that such interlayers can be formed from materials other than metal(s). Additional details about such bonding can be found, for example, in U.S. patent application Ser. No. 11/551,915, filed Oct. 23, 2006 and entitled "Systems and Methods for Bonding Semiconductor Substrates to Metal Substrates Using Microwave Energy," which is incorporated herein by reference in its entirety.

In many of such bonding applications, it is desirable to bond two or more semiconductor wafers. Such wafers can have multiple devices already fabricated on them; and such devices can include, for example, LED devices and MEMS devices. As such, it is desirable to bond such wafers with high quality so as to retain as many useful devices as possible. For the purpose of description herein, a wafer can include a whole wafer, or one or more partial wafers (e.g., one or more dies). Thus, one or more features of the present disclosure can be applied to bonding involving two whole wafers, a group of dies and a wafer, a first group of dies and a second group of dies. In certain situations, such groups of dies can be arranged so as to generally occupy the space of a wafer.

Use of microwave energy allows for a relatively quick bonding process. There are, however, certain conditions that are preferable when bonding semiconductor wafers via microwave energy. Various features that facilitate such preferable conditions are described herein.

Figure 1:
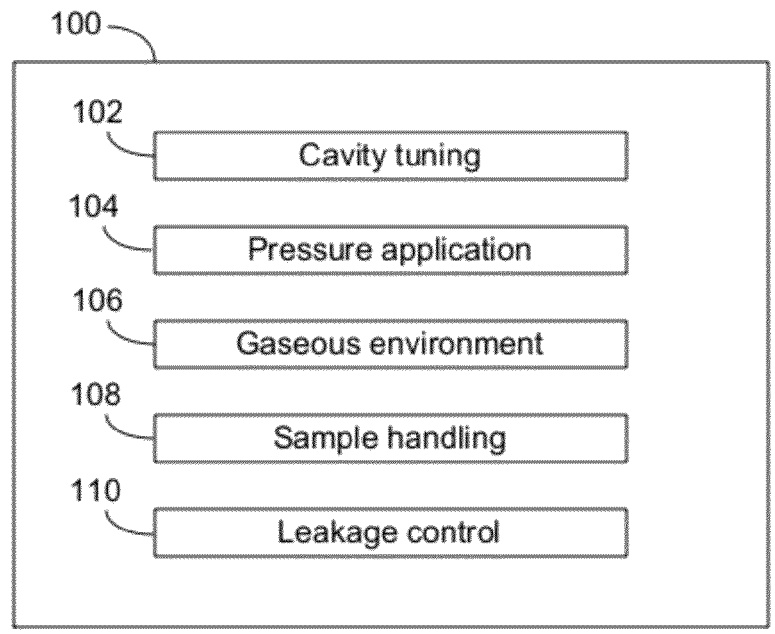
FIG. 1 shows that in certain embodiments, a microwave-based bonding system can include one or more features that facilitate more efficient and quick processing of the bonding process.

FIG. 1 shows a block diagram of a microwave bonding system 100 having various features that facilitate efficient, quick, and high-quality microwave bonding of semiconductor wafers. In certain embodiments, the bonding system 100 can include a cavity tuning component 102 configured to provide a desired transfer of microwave energy into the cavity. Examples and additional details of such a feature are described herein.

In certain embodiments, the bonding system 100 can include a pressure application component 104 configured to provide pressure to a stack of two or more wafers being bonded. As described herein, application of such pressure can facilitate a more uniform and higher quality bond between the two or more wafers. Examples and additional details of such a feature are described herein.

In certain embodiments, the bonding system 100 can include a gas environment control component 106 configured to provide a controlled gaseous environment for the stack of wafer being bonded. For example, providing a vacuum environment for the wafers can reduce oxidation during the bonding process. Examples and additional details of such a feature are described herein.

In certain embodiments, the bonding system 100 can include a sample handling component 108 configured to allow quick and efficient positioning and removal of the stack of wafers into and from the microwave cavity. Examples and additional details of such a feature are described herein.

In certain embodiments, the bonding system 100 can include a microwave leakage control component 110 configured to reduce leakage loss of microwave energy from the cavity. Examples and additional details of such a feature are described herein.

Figure 2:
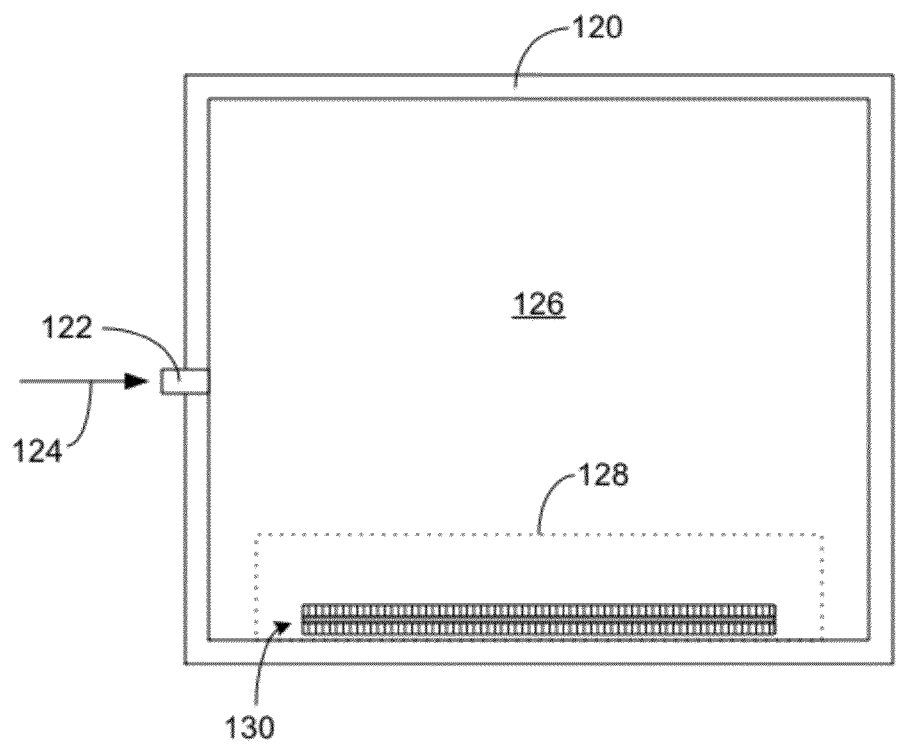
FIG. 2 shows that an assembly of wafers being processed can be introduced and positioned in a microwave cavity so as to minimally disturb a microwave mode of operation.

FIG. 2 shows a diagram of a bonding device that defines a microwave cavity 126. Such a cavity can be formed by, for example, a metallic housing 120. Microwave energy can be introduced (depicted by an arrow 124) into the cavity 126 by a waveguide, antenna, or some combination thereof (depicted as 122).

FIG. 2 also shows an assembly of wafers 130 being process inside the cavity 126. In certain embodiments, such an assembly of wafers can be introduced and held in a desired location and orientation inside the cavity 126 by a sample holder assembly 128. Preferably, the sample holder assembly 128 can be fabricated from low loss-tangent materials so as to reduce its influence on a microwave operating mode inside the cavity 126. Further, and as described herein, the sample holder assembly 128 can be configured so as to position the wafers near one of the cavity walls to again reduce disruption of the microwave operating mode inside the cavity 126. As also described herein, the sample holder assembly 128, by itself or in conjunction with one or more other components, can be configured to facilitate one or more of the desirable functionalities described in reference to FIG. 1.

Figure 3A:
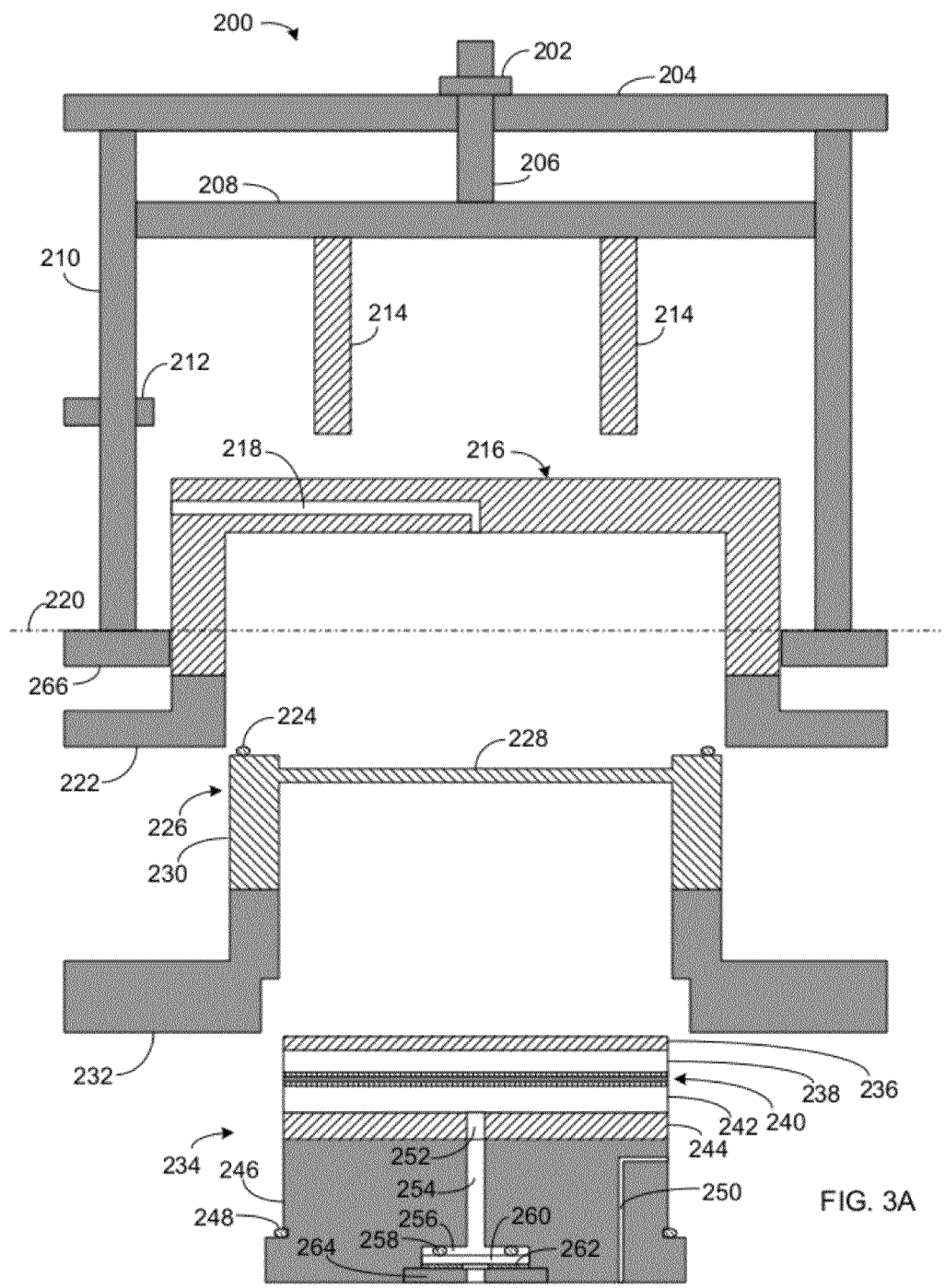
FIG. 3A shows an unassembled side sectional view of an example configuration of the system of FIG. 1.
Figure 3B:
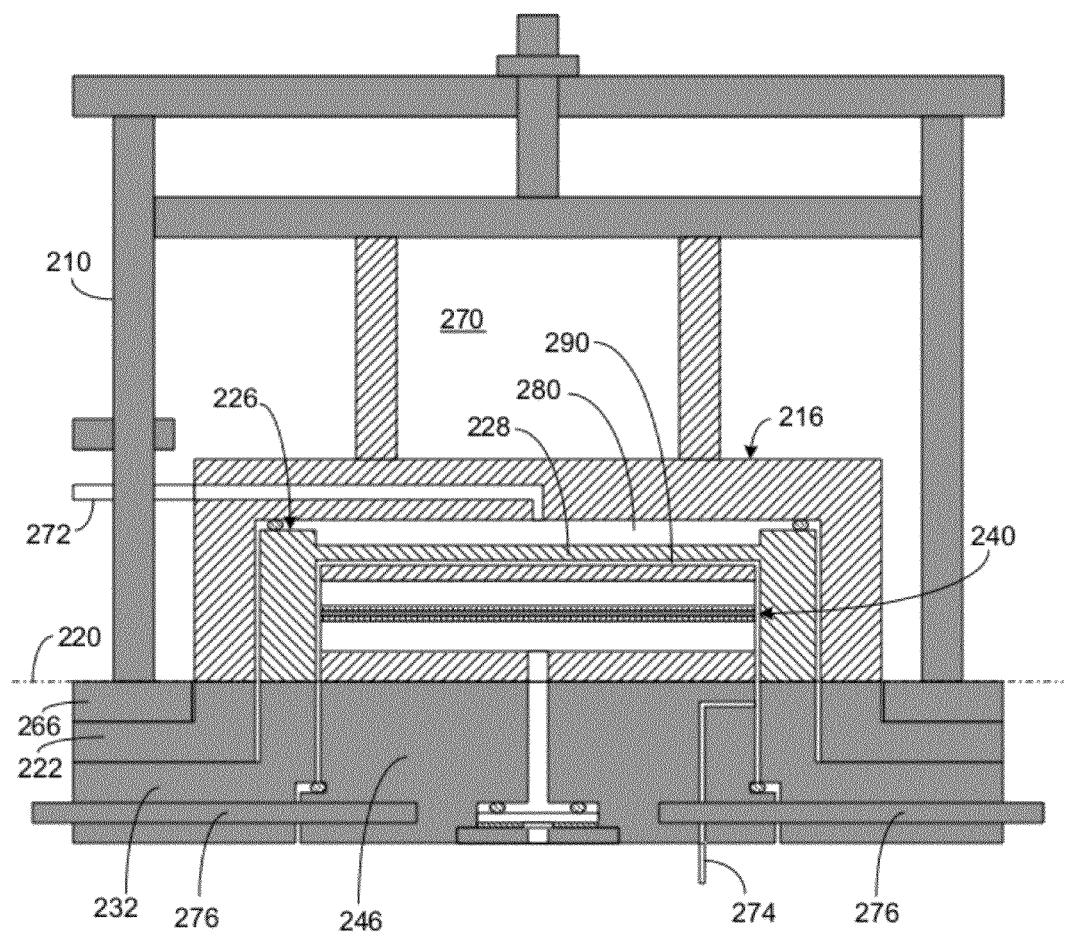
FIG. 3B shows an assembled view of the example system of FIG. 3A.

FIG. 3A shows an unassembled side sectional view of an example microwave bonding device 200. FIG. 3B shows an assembled side view of the same example device 200. For the purpose of description herein, and unless specified otherwise, metallic parts are depicted by shaded fill pattern, and low-loss tangent parts are depicted as diagonal line, vertical line, or unfilled patterns.

As shown in FIG. 3A, the bonding device 200 can includes a housing wall 210, a cap 208, and one or more base members (266, 222, 232, 246) that define a microwave cavity 270 when assembled (FIG. 3B). The cavity 270 can generally be defined as a volume between the inner surface of the cap 208, the inner surface (depicted by line 220) of the base members (266, 222, 232, 246), and the inner surface of the wall 210.

In certain embodiments, dimensions of the cavity 270 can be selected to support one or more operating modes of microwave energy delivered via a microwave input component 212. As described herein, lateral dimension (e.g., diameter) between the walls 210 can be selected to facilitate various sized wafers (e.g., 2-inch, 4-inch, 8-inch, 12-inch, and other sizes). The dimension between the base surface 220 and the cap (208) surface can be selected by positioning of the cap 208 at a desired location. In certain embodiments, the cap 208 can be movable with respect to the base surface 220, via, for example, a threaded rod 206 in cooperation with a housing lid 204 and a nut 202.

As shown in FIGS. 3A and 3B, a pressure housing 216 can be disposed so as to define, in conjunction with a membrane member 226, a pressurizable volume (280 in FIG. 3B). Pressurization of the volume 280 can be facilitated by a gas conduit 218 that can be defined relative to the pressure housing 216. Sealing of the volume 280 can be achieved by a sealing member 224 such as an O-ring disposed between the pressure housing 216 and the membrane member 226.

In certain embodiments, the pressure housing 216 can be made from low loss material such as PTFE (polytetrafluoroethylene). The pressure housing 216 can reside substantially inside the cavity 270 when assembled, and be supported by a metal base 222. As shown in FIGS. 3A and 3B, the pressure housing base 222 can be dimensioned to mate with and be secured to a base member 266. An example of how the pressure housing 216 can be joined to its base 222 is described herein in greater detail.

In certain embodiments, one or more support rods 214 can be disposed on the outside of the pressure housing 216 so as to inhibit movement of the housing 216 away from the base plane 220 when the volume 280 is under pressure. In certain embodiments, the support rods 214 can be made from low loss materials such PTFE.

In certain embodiments, the membrane member 226 can include a membrane 228 supported by an edge support structure 230. As described herein in greater detail, pressurization of the volume 280 results in the membrane 228 deforming away from the volume 280 so as to exert pressure to the stack positioned on the other side of the membrane 228. In certain embodiments, the membrane member 226 can be made from low loss materials such as PTFE as a single piece.

In certain embodiments, the membrane member 226 can reside substantially inside the cavity 270 when assembled, and be supported by a metal base 232. As shown in FIGS. 3A and 3B, the membrane member base 232 can be dimensioned to mate with and be secured to the pressure housing base 222. In certain embodiments, the membrane member 230 can be held in place between its base 232 and the sealing member 224 by mechanical pressure applied by securing of the base 232 to the pressure housing base 222.

As shown in FIGS. 3A and 3B, a sample holder assembly 234 can define, in conjunction with the membrane member 226, a controlled volume (290 in FIG. 3B) such as vacuum. Controlling of gas in the volume 290 can be facilitated by a gas conduit 250 (e.g., defined in the sample holder assembly 234). Sealing of the volume 290 can be achieved by a sealing member 248 such as an O-ring disposed between the membrane member 226 and the sample holder assembly 234.

In certain embodiments, the sample holder assembly 234 can include a base member 246 dimensioned to allow insertion into a recess defined by the membrane member base 232. The base member 246 can be made from metal, and its surface can be substantially coplanar with the base plane 220 when the bonding device 200 is assembled (FIG. 3B).

In certain embodiments, the base member 246 can define an aperture 254 that allows passage of infrared radiation for measurement of wafer temperature during the bonding process. As described herein, the aperture 254 can be part of the controlled gas environment (such as vacuum) that the wafers are subjected to. As such, the aperture 254 can be sealed from outside via a sealing member 258 (such as an O-ring), an IR-transparent window 260, and a gasket 262 (with a center hole) secured to the base member 246 via a cap 264 (with a center hole).

In FIGS. 3A and 3B, an assembly 240 of wafers is depicted as being positioned between various layers of low loss materials. For example, a layer of PTFE 244 can be positioned on the base member 246, and that layer 244 can define an aperture 252 to allow passage of infrared radiation. An IR-transparent layer 242 such as quartz can be positioned between the PTFE layer 244 and the wafer assembly 240 so as to provide a robust and substantially planar support for the wafer assembly. The quartz layer 242 also allows transmission of infrared radiation from the wafer.

The wafer assembly 240 is shown to be positioned between the first quartz layer 242 and another quartz layer 238. An additional PTFE layer 236 can be positioned above the second quartz layer 238. As described herein, dimensions and arrangements of various layers can be adjusted for different purposes. For example, thicknesses of one or more of the quarts layers and/or one or more of the PTFE layers can be adjusted to accommodate different numbers and bonding configurations of the wafers and yet maintain the overall thickness of the stack positioned on the base member 246. In certain embodiments, such a stack (including the wafer assembly) can reside substantially inside the cavity 270 when assembled, and be supported by the metal base member 246.

In FIG. 3B, gas conduits 272 and 274 are depicted as coupling with their respective conduits 218 and 250. Pressurizing, gas introduction, purging, vacuum formation, and other gas related operations can be achieved via such conduits and devices (not shown) in generally known manners. In certain embodiments, gas conduits 250 and 274 can be positioned and oriented in a number of different configurations. An example of such different configurations is described herein in reference to FIG. 10.

As shown in FIG. 3B, there can be a number of low loss structures inside the cavity 270. Despite the presence of such materials, the cavity 270 appears as a substantially hollow cavity to microwave radiation.

Figure 4:
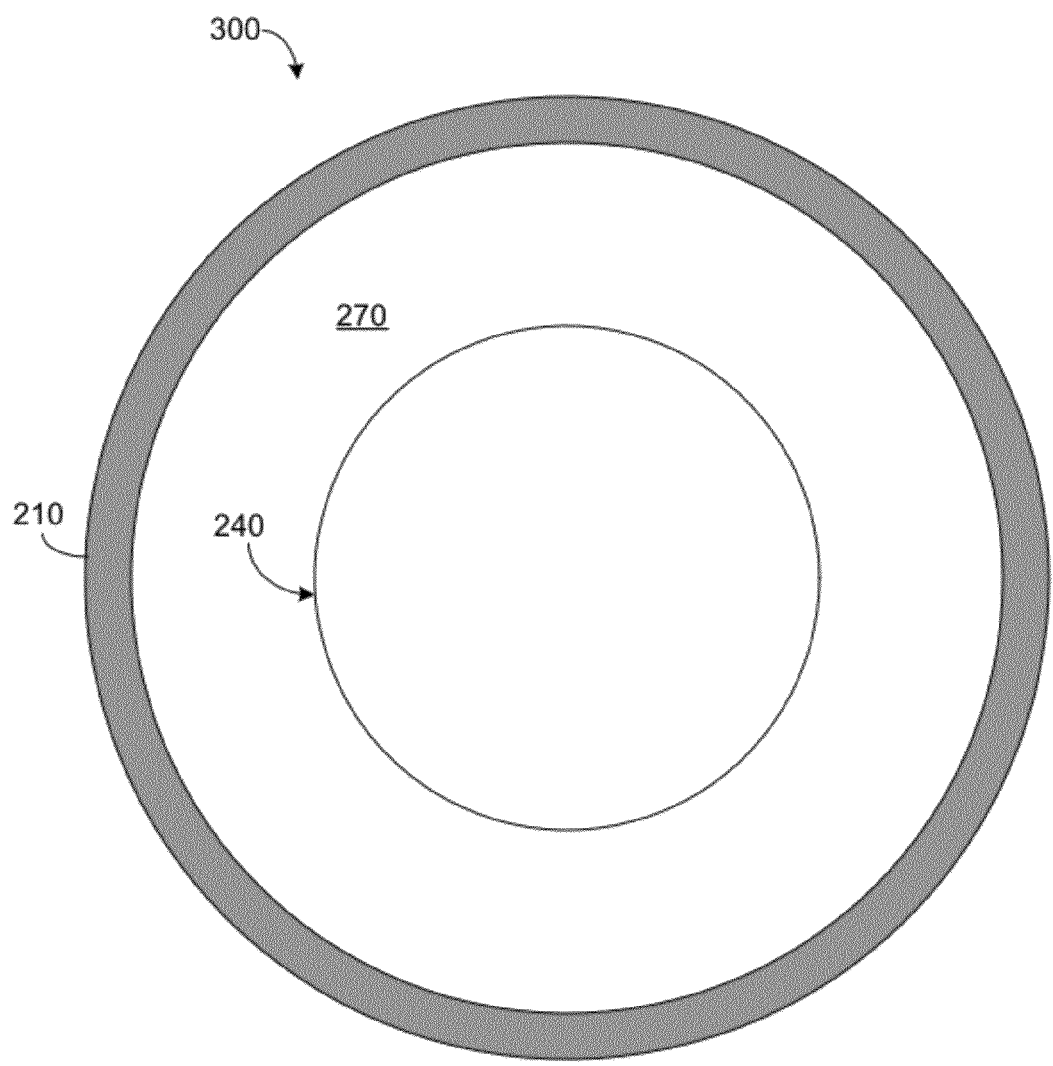
FIG. 4 shows that in certain embodiments, the microwave cavity and various components of the bonding system can be configured to process circular shaped wafers.

In certain embodiments, the microwave cavity can be shaped to generally match the shape of the wafers being processed. For example, FIG. 4 shows a cutaway plan view 300 of a housing wall 210 that defines a circular shaped cavity 270 to accommodate a circular shaped wafer assembly 240. Such symmetry between the wafer assembly 240 and the cavity 270 can facilitate reduced disruption of the microwave operating mode—in particular, when the wafer assembly 240 is positioned near one of the similarly shaped walls.

It will be understood that various features of the present disclosure do not necessarily depend on the cavity being circular in shape. Other shaped cavities and appropriately shaped components can be used to provide one or more functionalities that are similar to those described herein.

FIGS. 5 and 6 show an example of how the pressure housing 216 can be secured relative to the cavity 270. As described herein, pressurization of the volume 280 results in the volume 280 wanting to expand. Accordingly, the housing 216 may want to move away from its base 222. To counter such a tendency, one or more securing features can be provided.

For example, one or more support rods 214 can be provided to inhibit movement of the pressure housing 216 away from the base 222. In another example, the pressure housing 216 can be mechanically coupled to the base 222 in a robust manner.

An example of such coupling (312 in FIG. 5) is shown in FIGS. 6A and 6B. FIG. 6A shows a side sectional view of the coupling 312 between the PTFE housing 216 and the metal base 222. As shown, the end of the housing 216 can define a tongue 314 dimensioned to fit into a groove 316 defined by the base 222. A pin 318 is shown to extend through the tongue 314 and both sides of the groove 316 so as to hold the tongue 314 within the groove 316.

In certain embodiments, the pin 318 can be a metal pin, and a plurality of such pins can be distributed around the circumference of the coupling 312. For example, FIG. 6B shows a plan view of a portion of the circumference of the coupling 312, where the tongue 314 is in the groove 316. A plurality of the pins 318 are shown to be spaced (depicted by arrow 320) circumferentially. Such spaced pins 318 can distribute the force that wants to separate the pressure housing 216 from the base 222 when the volume 280 is pressurized.

In addition to distributing the separation force, the pins 318 can be spaced by a selected distance so as to reduce the effect of the groove 316 on the microwave operating mode. In certain embodiments, the spacing 320 between the neighboring pins, as well as the groove width (depicted as arrow 322) can be selected to be less than the wavelength of the microwave in use so as to reduce penetration of the microwave into the groove 316.

Figure 7:
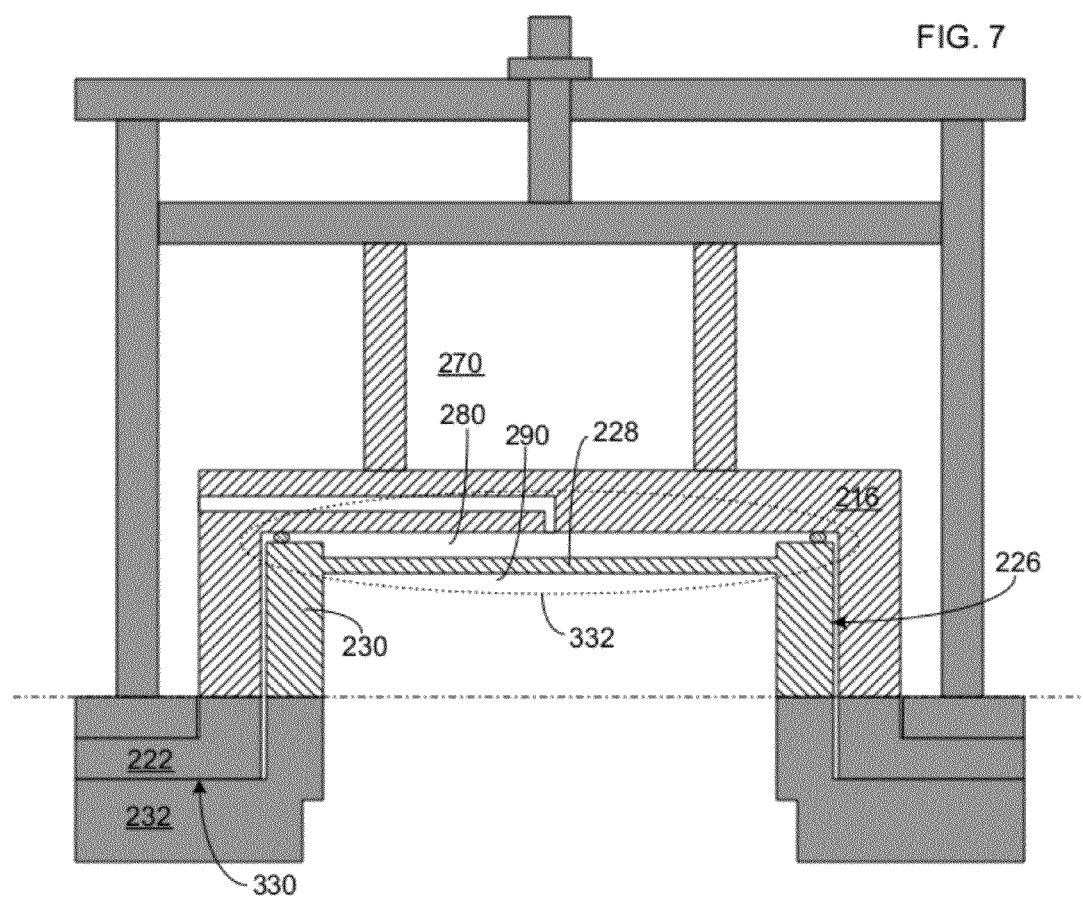
FIG. 7 shows an example of a pressure application device configured to provide distributed force to the assembly of wafers being processed.

FIG. 7 shows an example of how the membrane member 226 can be secured relative to the pressure housing 216 so as to provide the pressurizable volume 280. In certain embodiments, the membrane member 226 can be positioned on its base 232 and inserted into the recess defined by the pressure housing 216 and the housing base 222. The membrane member base 232 can be secured to the housing base 222 at their interface 330, such that the support structure 230 of the membrane member 226 is pressed between the base 232 and an interface depicted as 332, thereby securing the membrane member 226 in place and forming the sealed volume 280 between the membrane 228 and the pressure housing 216.

Figure 8A:
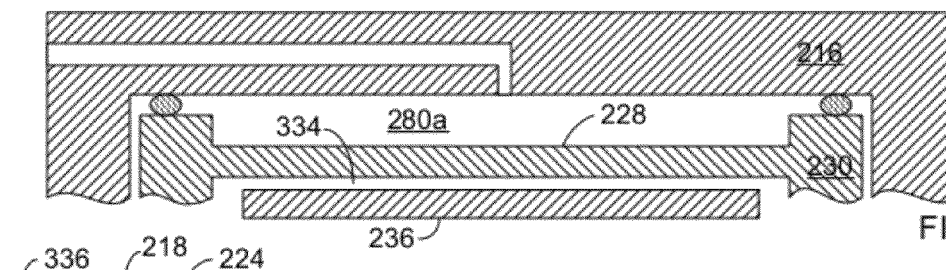
FIGS. 8A and 8B show examples of relaxed and pressurized modes of the pressure application device of FIG. 7.

FIG. 8A shows a more detailed view of the interface 332 between the membrane member 226 and the pressure housing 216, where the volume 280a is not pressurized such that the membrane 228 can be in its relaxed configuration. A PTFE layer 236 is shown to be positioned on the other side of the membrane 228 such that a gap 334 exists between the membrane 228 and the PTFE layer 236. The example PTFE layer 236 is in contact with the wafer assembly (not shown) via one or more intervening layers (also not shown). Thus, the gap 334 allows the wafer assembly to be unpressured when the volume 280a is not pressurized.

Figure 8B:
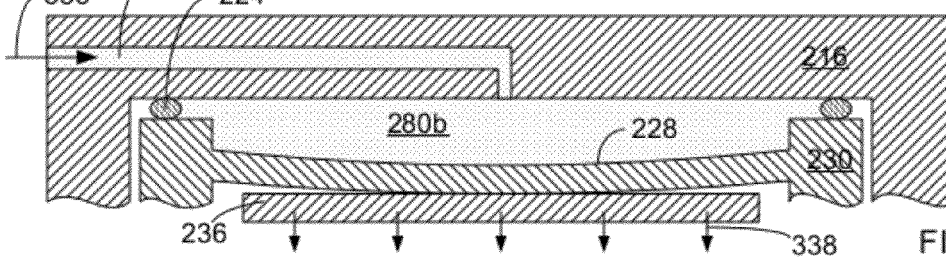

In FIG. 8B, the volume 280b is depicted as being pressurized by input (arrow 336) of gas through the conduit 218. As described herein, the sealing member 224 seals the pressurized volume 280b.

As shown, introduction of pressure in the volume 280b results in the volume 280b wanting to expand, thereby deforming the membrane 228 towards the PTFE layer 236. The deformation of the membrane 228 can be sufficient for the membrane to be displaced over the gap 334 and engage the PTFE layer 236. Such engagement can provide a pressing force distributed substantially throughout the PTFE layer 338 (depicted as arrows 338). Such a pressing force can then be transferred to the wafer assembly.

In certain embodiments, the membrane 228 can be dimensioned so as to provide such deformation in the membrane's elastic region, thereby allowing repeated use of the membrane member 226. In certain embodiments, the membrane member 226 can be a single piece made from low loss material such as PTFE. For example, a membrane member (226) dimensioned for use with 4-inch wafers can be a single piece formed from PTFE, and the membrane (228) can have a thickness of approximately 2 mm and a diameter of approximately 10.2 cm.

As described herein, the pressurized volume (280b in FIG. 8B) can be a relatively small volume. More particularly, the pressurized volume can be a layer-like volume that is relatively thin and having a lateral dimension similar to that of the membrane 228. Because of such a small pressurized volume, managing pressure-related components can be relatively easy. At the same time, the shape of the pressurized volume still allows application of a pressing force that is distributed over a relatively large area.

Figure 9A:
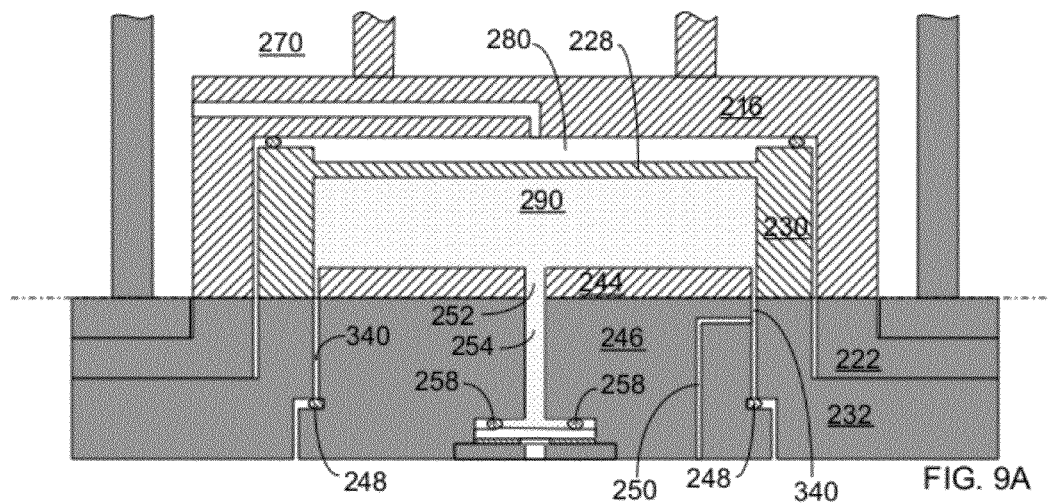
FIG. 9A shows an example of a gas environment control system having a relatively small volume and able to provide a controlled gas environment for the wafers being processed.

FIG. 9A shows the partitioning of the pressurizable volume 280 and the controlled gas environment volume 290 from the microwave cavity 270. In certain situations, the controlled gas environment can include a vacuum environment to reduce oxidation of the semiconductor wafers during the bonding process. In certain embodiments, a vacuum condition of approximately 10 m-Torr or less can be achieved and maintained in the volume 290. Other ranges of vacuum conditions are also possible.

As with the pressurizable volume 280, the volume 290 can be relatively small when compared to the microwave cavity volume 270. As such, evacuation and any other gas operation can be achieved relatively quickly due to the small volume.

In FIG. 9A, the volume 290 is shown to include the space that would be occupied by the stack (342 in FIG. 9B), the apertures 252 and 254, the space inside of the O-ring 258, and the gaps (340) between the sample holder base 246 and the membrane member base 232. Even with all of such spaces, the total volume is still relatively small compared to the microwave cavity volume 270.

Figure 9B:
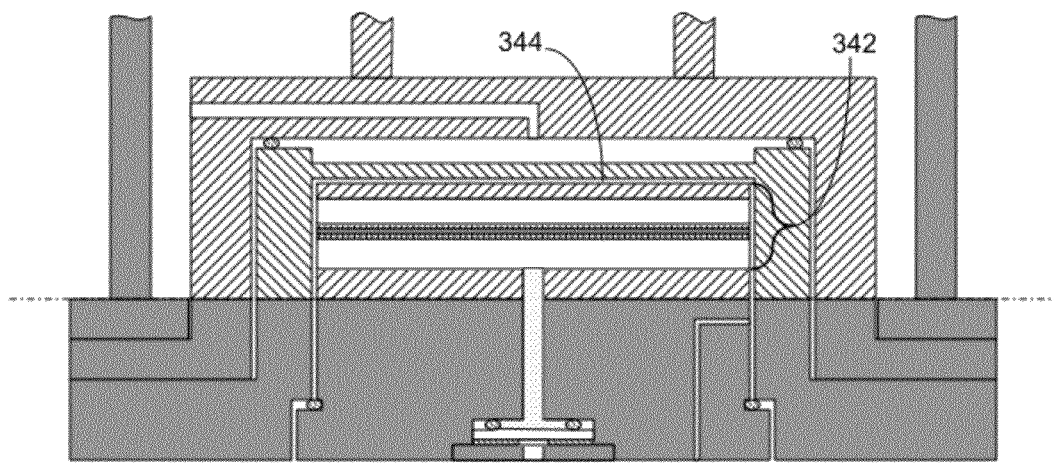
FIG. 9B shows that the relatively small volume of controlled gas environment can be even smaller when the wafer assembly and one or more support layers are positioned therein.

In FIG. 9B, a substantial portion of the volume 290 is shown to be occupied by the stack 342. As such, the remaining volume 344 to be evacuated is even smaller. Accordingly, gas operations such as cycling of forming gas in between bonding procedures, as well as evacuations prior to microwave heating, can be achieved quickly, thereby greatly increasing the overall throughput of bonding operations.

Figure 10:
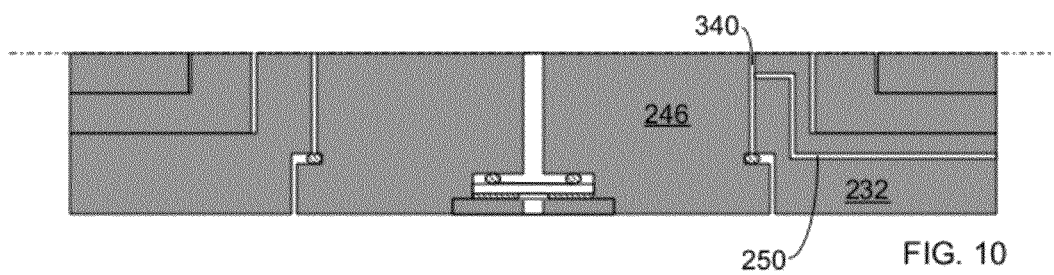
FIG. 10 shows an alternate way of providing a gas pathway to facilitate the controlled gas environment of FIGS. 9A and 9B.

In FIGS. 9A and 9B, the example gas conduit 250 is shown to be formed in the base 246 so as to be in communication with the volume 290. In certain embodiments, such a conduit can be configured differently. For example, in FIG. 10, the gas conduit 250 is shown to be formed as part of the base 232 for the membrane member (not shown) so as to be in communication with the same volume 290. The example conduit 250 of FIG. 10 is further shown to extend to the side of the base assembly so as to facilitate gas connection(s) at the side of the bonding device instead of the bottom. Other configurations are also possible.

In certain embodiments, pressure housing 216 and the membrane member 226 normally remain secured within the microwave cavity, and are removed only as needed (e.g., to replace the membrane member if the membrane becomes damaged from repeated deformations). During a typical bonding operation, only the sample holder needs to be removed and installed.

Figure 11A:
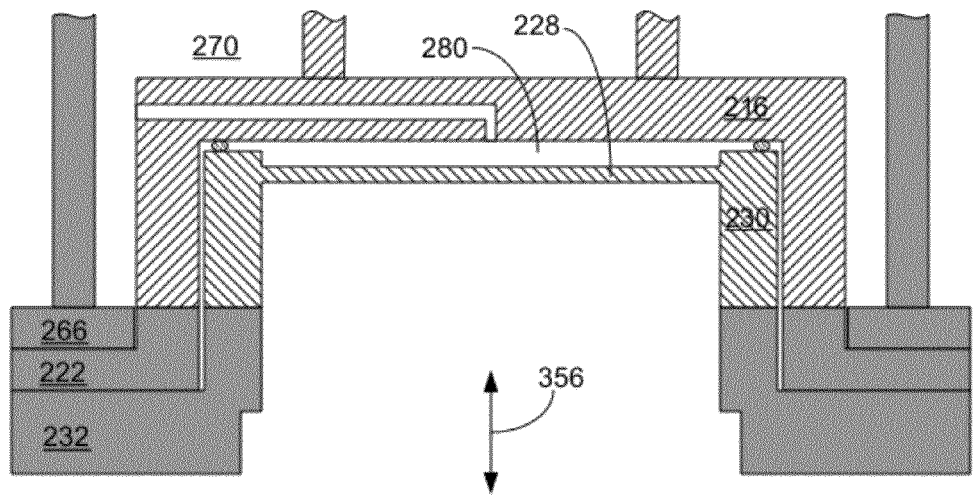
FIG. 11A shows an example wafer assembly holder that can facilitate the pressure application device of FIG. 7 and the gas environment control system of FIGS. 9 and 10.
Figure 11A:
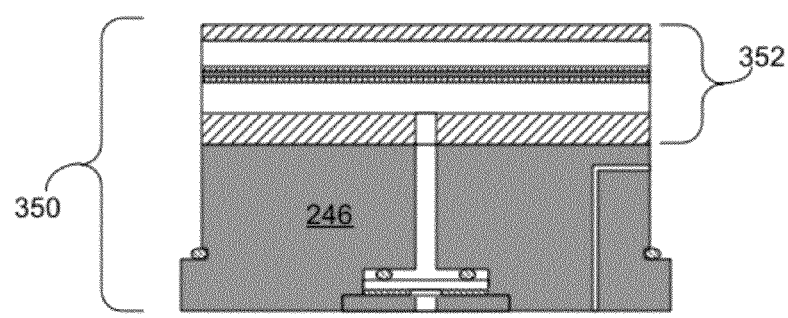
Figure 11B:
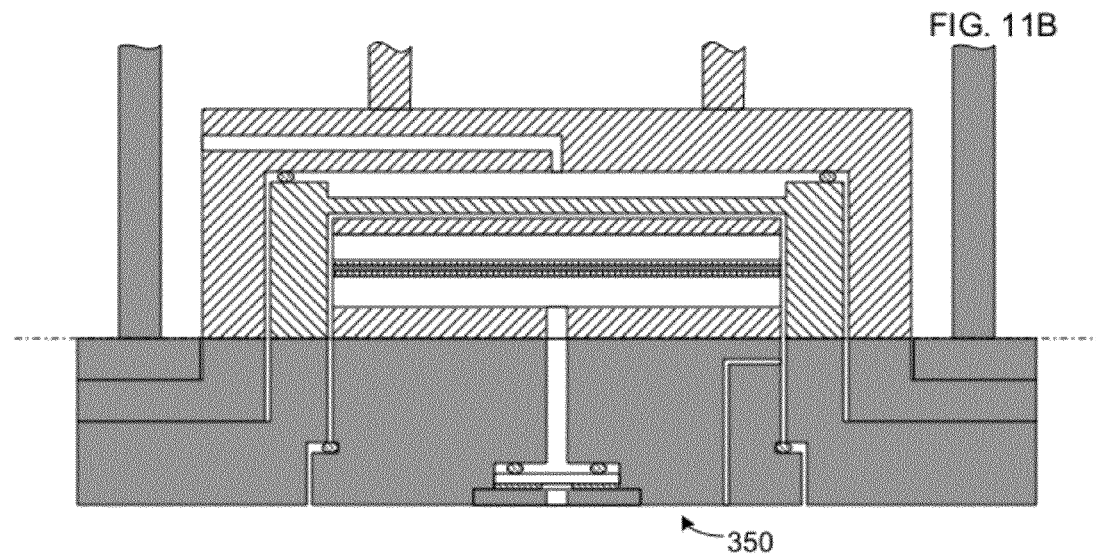
FIG. 11B shows the example wafer assembly holder installed in the bonding system.

FIG. 11A shows such removal and installation (depicted by arrow 356) of an assembly 350 that includes the sample holder base 246 and a stack assembly 352. FIG. 11B shows the assembly 350 installed so as to position the stack assembly 352 in the microwave cavity for operation.

Figure 12:
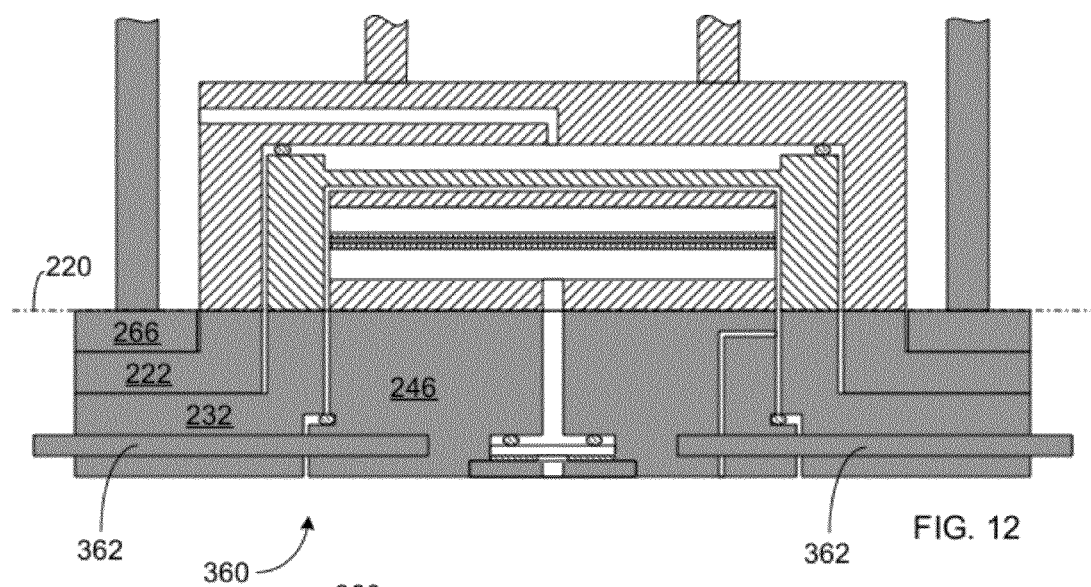
FIG. 12 shows an example of how the wafer assembly holder can be secured in a relatively quick manner.

In certain embodiments, there are a number of ways in which the assembly 350 can be secured to and released from the bonding device. FIG. 12 shows an example configuration 360 where the assembly of the base 246 and the stack thereon can be secured to and released from the bonding device quickly and accurately. As shown, the bases 232 and 246 can define one or more sets of aligned holes for receiving one or more securing dowels 362. In certain embodiments, such dowels (as well as base members 246, 232, 222, and 266) can be made with precision from metal so as to allow proper aligning of the base 246 relative to the base surface 220. In certain embodiments, the base 232 can be fastened to base members 222 and 266 via, for example, a plurality of bolts (not shown).

Figure 13:
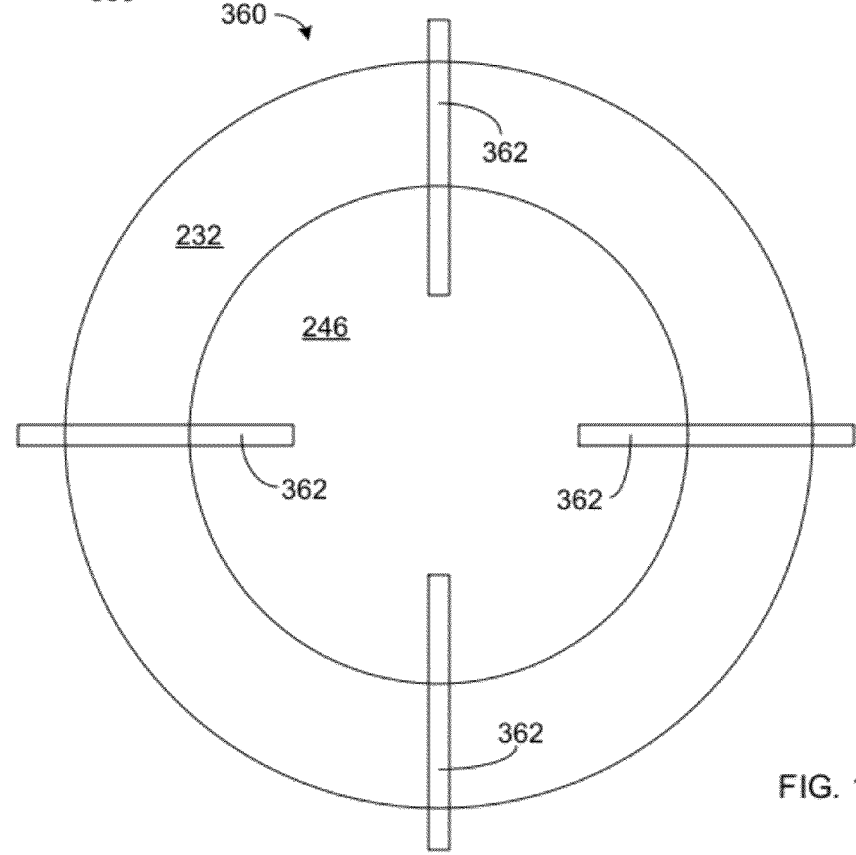
FIG. 13 shows a plan view of the example quick securing mechanism of FIG. 12.

FIG. 13 shows a plan view of the example dowel configuration where four dowels 362 are shown to be distributed circumferentially so as to accurately secure the sample holder base 246 to the membrane member base 232. Other numbers of dowels, as well as circumferential distribution of such dowels, are also possible. In certain embodiments, the example securing configuration shown in FIGS. 12 and 13 can facilitate relatively quick introduction and removal of samples into and from the microwave cavity.

Figure 14:
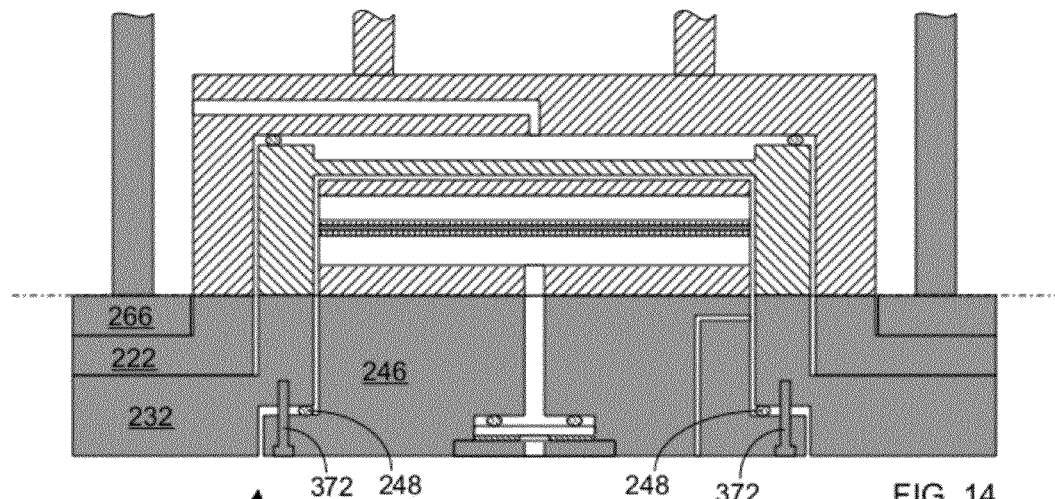
FIG. 14 shows another example of how the wafer assembly holder can be secured.

FIG. 14 shows another example configuration 370 for securing the assembly of the base 246 and the stack thereon to the bonding device. As shown, a plurality of bolts 372 can extend through the bottom of the sample holder base 246 and into the base 232 for the membrane member. A sealing member 248 such as an O-ring can provide sealing functionality for the resulting controlled gas volume. In certain embodiments, the base 232 can be fastened to base members 222 and 266 via, for example, a plurality of bolts (not shown).

In certain embodiments, the plurality of bolts can be arranged about the circumference of the base 246. For example, FIG. 15 shows a bottom view of the base 246 having eight bolts 372 distributed generally evenly throughout the circumference of the base 246.

Figure 15:
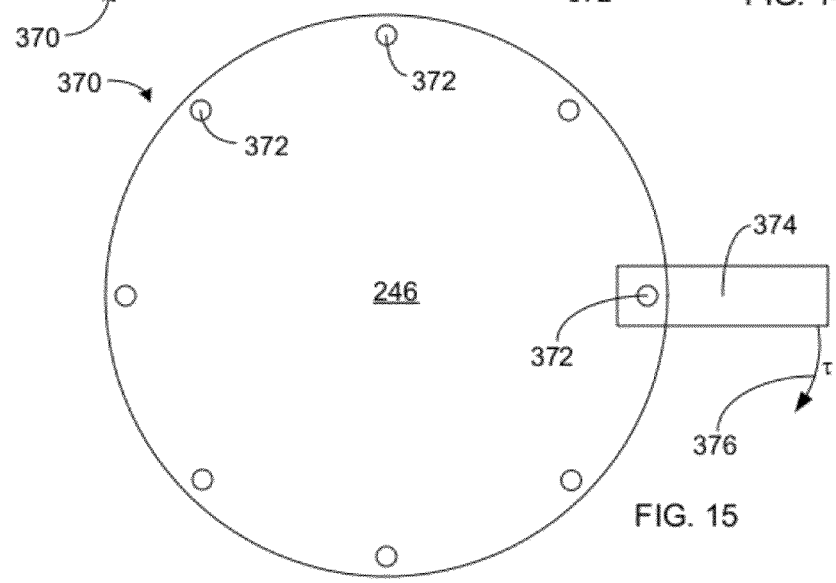
FIG. 15 show a plan view of the example securing mechanism of FIG. 14.

As further shown in FIG. 15, such securing bolts 372 can be tightened in a controlled manner—for example, using a torque wrench 374 (depicted by arrow 376 as providing torque $\tau$)—so as to provide a generally uniform tightening of the base 246 to the membrane member base 232. Such controlled tightening of the bolts 372 can ensure that the two base members 246 and 232 are aligned properly relative to each other. In certain embodiments, the example securing configuration shown in FIGS. 14 and 15 is generally slower in introduction and removal of samples into and from the microwave cavity than the example configuration described in reference to FIGS. 12 and 13.

Figures 16A, 16B, 16C:
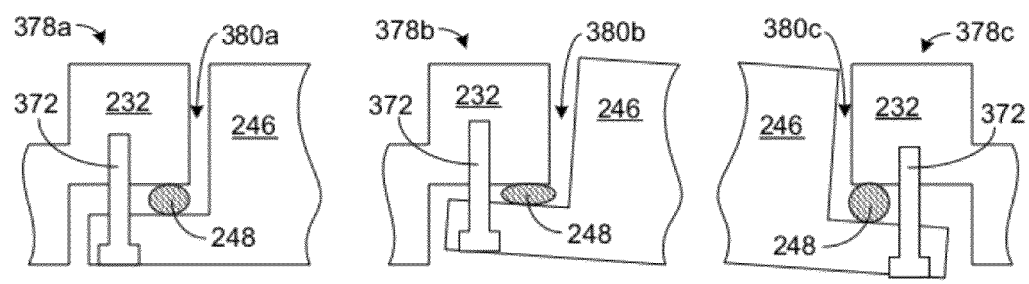
FIGS. 16A-16C show examples of how torque applied during tightening of the securing mechanism of FIG. 15 can affect the quality of microwave cavity integrity.

For example, FIG. 16A shows a situation 378a where the bolt 372 has been tightened properly so as to secure the two base members (246, 232) in a desired orientation. Such proper tightening can also properly deform the O-ring 248 to provide desired sealing functionality.

As shown in FIG. 16A, a proper tightening of the bolt 372 can yield a gap 380a having a desired shape. For example, a parallel gap 380a having certain design dimensions can be achieved. In certain embodiments as described herein, dimensions of such gaps can be selected so as to reduce leakage of microwave radiation from the cavity during operation.

FIGS. 16B and 16C show that shape of the example gap 380 can be distorted when the bolts 372 are not tightened properly. For example, FIG. 16B shows a situation 378b where the bolt 372 has been tightened too much. Accordingly, the O-ring 248 is shown to be deformed too much, and the gap 380b is shown to open up away from the O-ring 248. In another example, FIG. 16C shows a situation 378c where the bolt 372 has not been tightened enough. Accordingly, the O-ring 248 is shown to be deformed insufficiently, and the gap 380c is shown to close away from the O-ring 248. Either or both of the distorted gaps 380b and 380c can contribute to a greater amount of microwave leakage. Further, the insufficiently deformed O-ring 248 in FIG. 16C can result in a degraded sealing performance.

Figure 17:
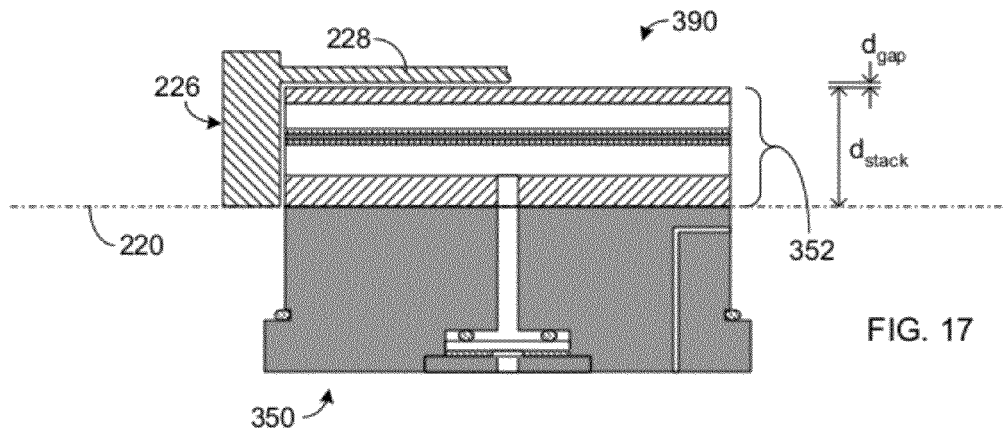
FIG. 17 shows that in certain embodiments, a stack that can include the wafer assembly can have a selected thickness so as to facilitate the pressure application device and the gas environment control system.

FIGS. 17 and 18 show that in certain embodiments, the microwave bonding system of the present disclosure can be configured to allow processing of different numbers of wafers. In certain embodiments as shown in FIG. 17, a configuration 390 can be implemented where the stack 352 positioned on the sample holder base has a selected overall thickness $d_{stack}$. Such thickness can be selected so as to provide a selected gap (thickness $d_{gap}$) between the top of the stack 352 and the surface of the membrane 228. Such gap thickness can allow easy positioning of the sample holder assembly 350, and yet facilitate efficient application of pressure as described herein in reference to FIGS. 8A and 8B.

In FIG. 17, the stack 352 is depicted as having an assembly of two wafers with a metal interlayer therebetween. Other configurations of the wafer assembly are also possible. In fact, various design features of the sample holder assembly 350 can facilitate easy adaptation to accommodate different numbers and/or arrangements of wafers.

Figure 18A:
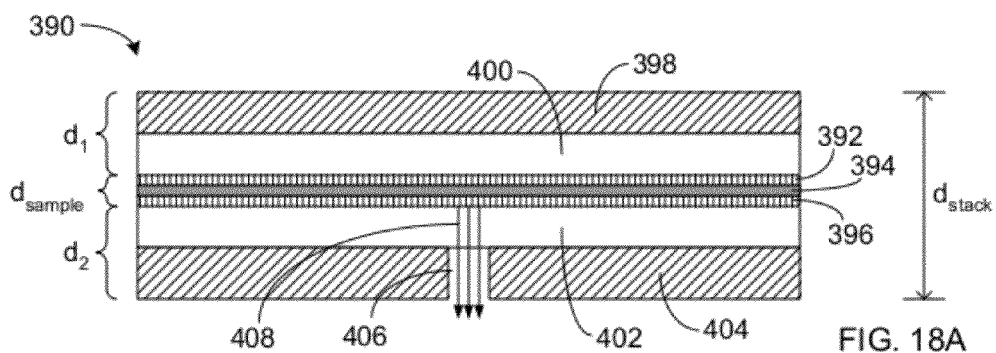
FIGS. 18A-18C show non-limiting examples of how different numbers of wafers can be bonded.

For example, FIG. 18A shows a basic configuration 390 where two wafers 392 and 396 are being bonded via a metal interlayer 394. The assembly of such wafers and interlayer is depicted as having a thickness of $d_{sample}$. The overall thickness of the stack is $d_{stack}$, such that $d_{sample}$ in combination with $d_1$ (above the wafer assembly) and $d_2$ (below the wafer assembly) can add up to be approximately same as $d_{stack}$.

In the example configuration 390, the wafer assembly (392, 294, 396) is shown to be sandwiched between two low loss plates 400 and 402 such as quartz plates. Such plates (400, 402) can provide planar supports from both sides of the wafer assembly, and also allow passage of infrared radiation (arrows 408) for temperature monitoring.

In the example configuration 390, low loss plates 398 and 404 such as PTFE plates can be provided above and below the quartz-wafer assembly-quartz assembly. In certain embodiments, such plates (398, 404) can provide desired mechanical properties that facilitate some cushioning for gradual compression and rigidity for transmission of pressure from one side to the other.

Figure 18B:
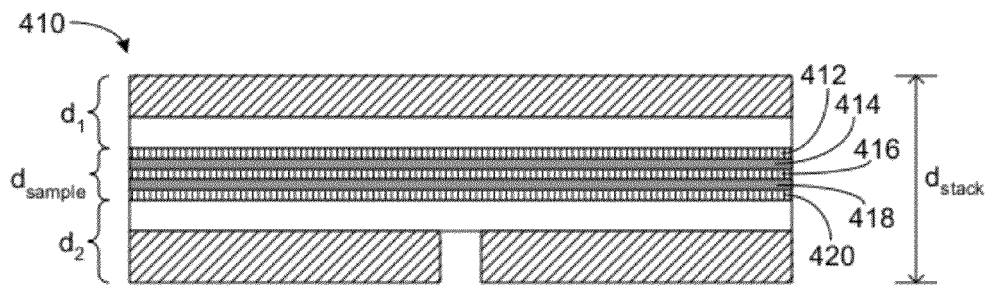

In certain embodiments, thickness(es) of one or more of the plates 398, 400, 402, and 404 can be selected to achieve the desired overall stack thickness $d_{stack}$ for a given thickness of the wafer assembly. For example, FIG. 18B shows an example configuration 410 where the wafer assembly includes wafers 412, 416, and 420 and interlayers 414 and 418 interleaved between the wafers. In such a configuration, the three wafers can be bonded together via microwave heating of the interlayers.

In the example configuration 410 of FIG. 18B, the wafer assembly thickness will likely be thicker than the wafer assembly of FIG. 18A. Accordingly, one or more of the quartz and/or PTFE plate thicknesses can be adjusted so as to maintain the overall stack thickness.

Figure 18C:
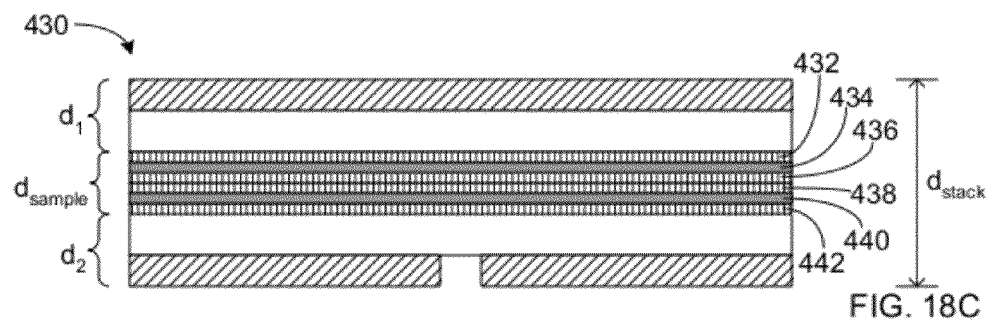

In another example, FIG. 18C shows an example configuration 430 where the wafer assembly includes wafers 432 and 436 being bonded together via an interlayer 434, and another set of wafers 438 and 442 being bonded together via an interlayer 440. Thus, two sets of wafer-interlayer-wafer assemblies can be processed at the same time.

In the example configuration 430 of FIG. 18C, the wafer assembly thickness will likely be thicker than the wafer assemblies of FIGS. 18A and 18B. Accordingly, one or more of the quartz and/or PTFE plate thicknesses can be adjusted so as to maintain the overall stack thickness.

It will be understood that other arrangements of wafers and interlayers are also possible.

Figure 19:
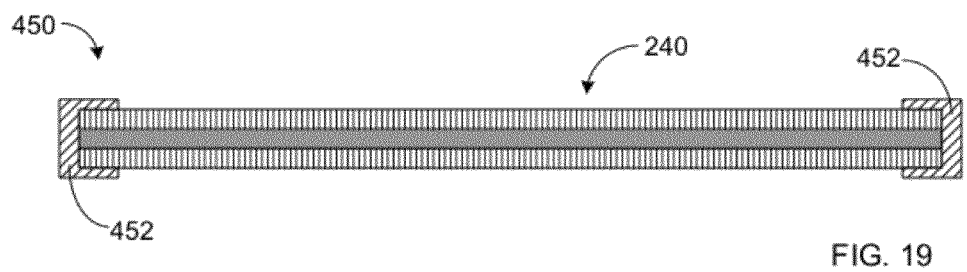
FIG. 19 shows that in certain embodiments, the wafer assembly can include one or more clips that can hold the assembly of wafers in a desired aligned orientation.
Figure 20:
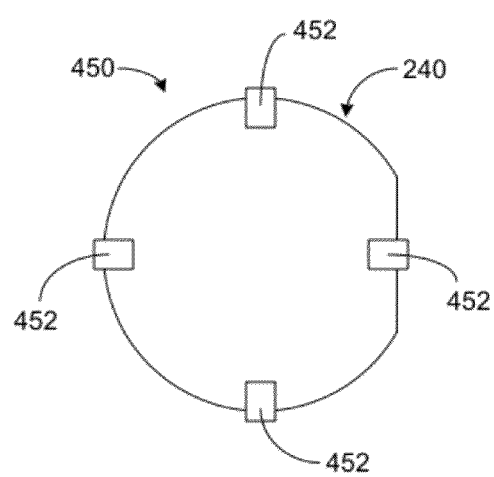
FIG. 20 shows a plan view of the wafer assembly clips of FIG. 19.
Figure 21:
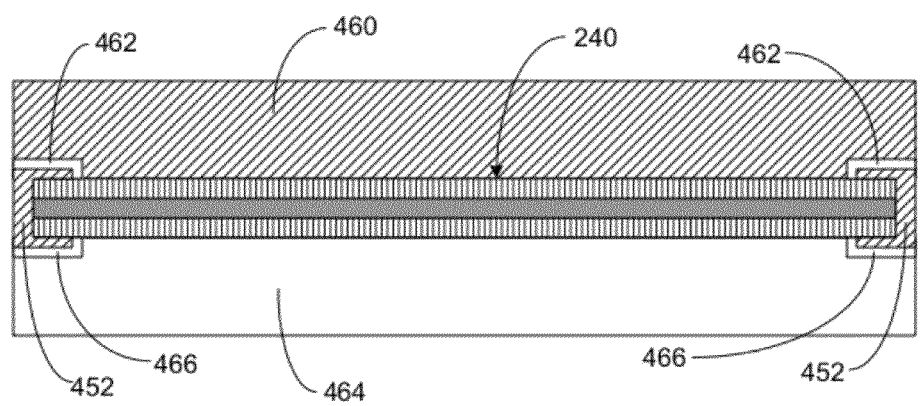
FIG. 21 shows that in certain embodiments, one or more layers of the stack adjacent the wafer assembly can define recesses or cutouts dimensioned to accommodate the wafer assembly clips.

In certain situations, accurate alignment and maintaining of aligned wafers can be important. To facilitate such requirements, two or more wafers can be aligned by using a known technique (e.g., optical alignment of visible marks on the wafers). FIGS. 19-21 show one or more features that can be implemented to facilitate maintaining of such aligned wafers.

In FIG. 19, an example assembly of wafers 240 is shown to be retained together by one or more retaining clips 452. Although the example assembly 240 shows two wafers and an interlayer, it will be understood that other numbers of wafers and interlayers are also possible. Also, for the purpose of description, it will be assumed that the wafers of the assembly 240 have already been aligned.

In certain situations, a plurality of clips 452 can be disposed around the circumference of the wafer assembly. For example, FIG. 20 shows four clips 452 deployed at 12, 3, 6, and 9-o'clock positions.

In certain embodiments, plates that engage the upper and lower surfaces of the wafer assembly 240 can be modified to accommodate the one or more retaining clips 452. For example, FIG. 21 shows an example configuration where a plate 460 above the wafer assembly 240 can define appropriately located recesses 462 to accommodate the clips 452 so as to retain a substantially planar engagement between the plate 460 and the upper surface of the wafer assembly 240. Similarly, a plate 464 below the wafer assembly 240 can define appropriately located recesses 466 to accommodate the clips so as to retain a substantially planar engagement between the plate 464 and the lower surface of the wafer assembly 240.

In the context of configurations where quartz and PTFE are used as support plates, such retainer-accommodating recesses can be formed on either quartz or PTFE plates, depending on which plate is positioned next to the wafer assembly.

As described herein, maintaining the integrity of microwave operating mode (e.g., a single mode operation) is a desired feature. Such a feature can include reducing microwave leakages from the cavity as much as possible. As described herein, various gaps can be either dimensioned appropriately and/or shielded to reduce the likelihood of microwave losses.

In certain embodiments, one of the design considerations can include dimensioning various gaps and recesses associated with the microwave cavity so as to reduce leakage. Generally, dimensions associated with gaps can be selected to be less than the operating microwave wavelength. Such a configuration can reduce the penetration of the microwave into the gaps. For example, and as described herein in reference to FIGS. 6A and 6B, dimensions associated with retaining pin spacings (320 in FIG. 6B) and/or groove width (322 in FIG. 6B) can be selected to be less than the wavelength of the microwave in use so as to reduce penetration of the microwave into the groove (316 in FIG. 6A).

Figure 22:
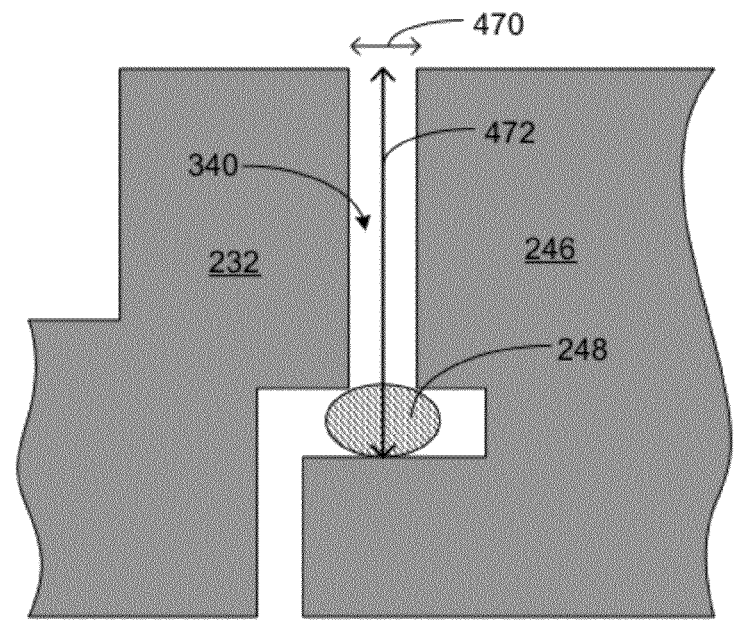
FIG. 22 shows that in certain embodiments, one or more gaps in the bonding system can be dimensioned so as to reduce leakage of microwave energy from the cavity.

In certain embodiments, dimensions associated with a gap can be selected so as to facilitate a standing wave in the gap. For example, FIG. 22 shows an example gap 340 that can exist between the base members 232 and 246. The gap 340 is shown to have dimensions indicated by arrows 470 and 474. The length of the dimension 472 can be selected so as to be approximately a multiple of half-wavelength. Such a dimension can facilitate a standing wave in the gap or recess so as to reflect substantially all of the energy back into the cavity.

Figure 23:
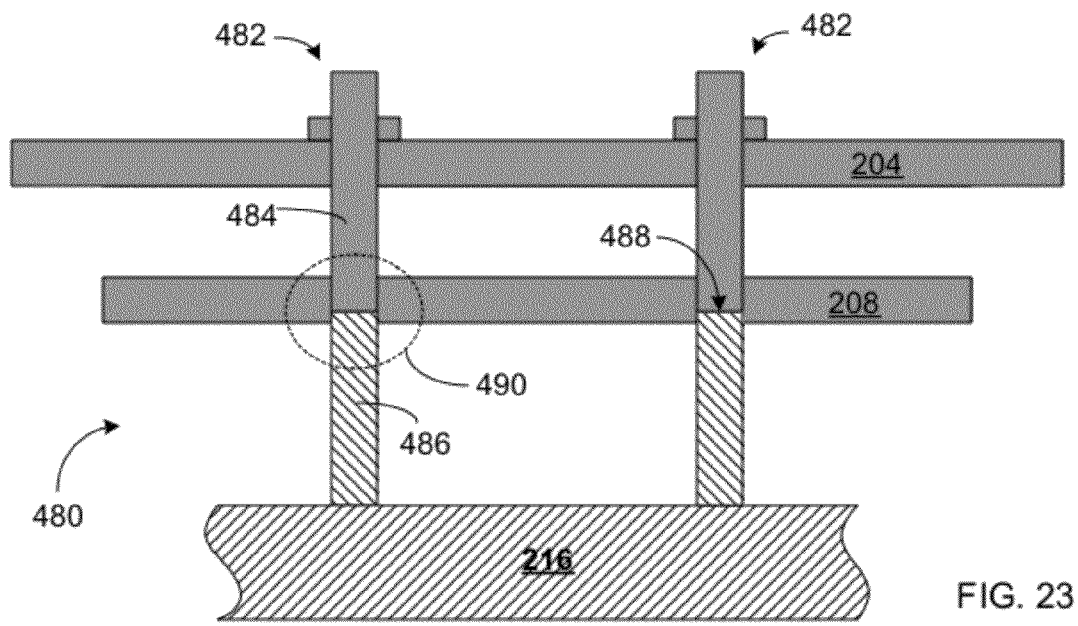
FIG. 23 shows that in certain embodiments, support rods that provide support for the pressure housing can be a composite rod having low-loss material in the cavity and metal outside of the cavity.

In certain embodiments, it may be desirable to provide a plurality of pressure housing support rods, where each rod can be adjusted for height separately. FIG. 23 shows that such a configuration 480 can be implemented with use of a plurality of composite rods 482, where each rod 482 includes a low loss portion 486 (such as PTFE) and a metal portion 484. The metal portion 484 can extend through the housing lid 204 so as to be adjustable via a nut. The metal portion 484 of the rod 482 can extend partially through the cavity cap 208 such that the metal portion 484 and the cap 208 define a low loss environment recess.

As shown in FIG. 23, the PTFE portion 486 of the rod 482 can be mechanically coupled to the metal portion 484 in the recess. Such mechanical coupling can be achieved in a number of ways. For example, the PTFE portion can be held in place between the metal portion 484 and the pressure housing 216.

Figure 24:
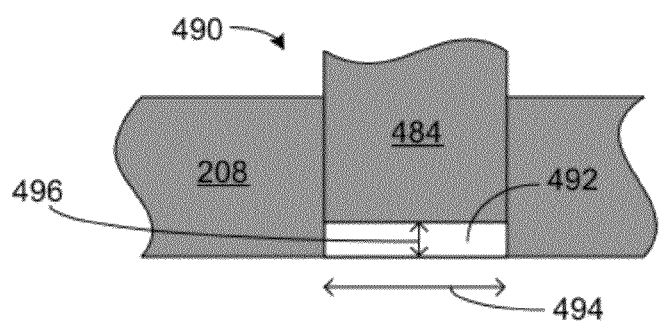
FIG. 24 shows an example of how the interface of the composite materials in the support rod of FIG. 23 can be configured to minimally disturb a microwave mode of operation.

A more detailed view of the recess 492 is shown in FIG. 24. The recess 492 is shown to have lateral (arrow 494) and depth (arrow 496) dimensions. In certain embodiments, one or more of such dimensions can be selected so as to reduce disruption of the microwave operating mode. For example, the depth 496 can be minimized so as to reduce deviation from a desired surface (e.g., a planar surface) associated with the microwave cavity. In certain embodiments, the depth 496 can be dimensioned so as to provide a standing wave configuration as described herein in reference to FIG. 22. In another example, the lateral dimension 494 can be selected to be less than the wavelength of the microwave in use so as to reduce penetration of the microwave into the recess 492.

Implementing various features as described herein, high quality bonding of wafers can be achieved relatively quickly. For example, two 4-inch wafers can be bonded in approximately 8 minutes. With further tuning of various operating configurations, it is expected that the bonding process can be reduced even further to, for example, approximately 2-3 minutes. As described herein, introduction and removal of the wafers into and from the cavity can be achieved relatively quickly also, so as to allow high throughput processing of wafers. Table 1 lists approximate times taken for various steps associated with bonding of two 4-inch wafers.

TABLE 1

| Step | Approximate time |
| --- | --- |
| Insertion and securing of the sample holder | 0.5 minute |
| Formation of desired vacuum condition | 0.5 to 1 minute |
| Microwave heating to yield desired bond | 8 minutes |
| Cooling to desired level | 2 to 5 minutes |
| Removal of the sample holder | 0.5 minute |

Also importantly, such bonding can yield high quality bonds with little or no voids in the bonded interfaced. In certain embodiments, one or more features of the present disclosure can contribute to both quick and high-quality nature of the bonds.

Although the above-disclosed embodiments have shown, described, and pointed out the fundamental novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the appended claims.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

What is claimed is:

1. A microwave bonding apparatus, comprising:
a cavity housing having a plurality of inner metal surfaces that define a microwave cavity configured to receive microwave energy in a mode of operation;
a pressure housing coupled to a part of a base surface so as to be positioned substantially within said microwave cavity, said base surface being one of said plurality of inner metal surfaces;
a membrane coupled to a part of said base surface and positioned substantially within said microwave cavity and between said pressure housing and base surface, said membrane having first and second surfaces such that said pressure housing and said first surface of said membrane define a first volume that can be pressurized to deform said membrane;
a sample holder having a metal surface dimensioned to receive a stack that includes two or more wafers being bonded and position said stack substantially within said microwave cavity, said metal surface being a part of said base surface when said sample holder is installed such that said stack is between said second surface of said membrane and said base surface, said stack dimensioned so as to allow said stack to be compressed between said second surface and said metal surface when said membrane deforms due to said pressurization of said first volume.

2. The apparatus of claim 1, wherein said pressure housing and said membrane are formed substantially from low loss-tangent materials so as to substantially maintain said microwave mode of operation in said microwave cavity.

3. The apparatus of claim 2, wherein said pressure housing and said pressure housing and said membrane are formed from polytetrafluoroethylene.

4. The apparatus of claim 1, wherein said membrane is coupled to said base surface by a support wall that supports said membrane's circumference, said support wall being dimensioned to receive said stack.

5. The apparatus of claim 4, wherein said support wall and said membrane are formed as an integral piece from same material.

6. The apparatus of claim 1, further comprising one or more pressure coupling devices and features configured to allow pressurization of said first volume.

7. The apparatus of claim 6, wherein said one or more coupling devices and features comprise a pressure conduit formed within said pressure housing so as to be in communication with said first volume.

8. The apparatus of claim 1, further comprising one or more gas control devices and features configured to provide a controlled gas environment to a second volume defined by said second surface of said membrane and said metal surface of said sample holder.

9. The apparatus of claim 8, wherein said one or more gas control devices and features comprise a gas conduit formed within said sample holder so as to be in communication with said second volume.

10. The apparatus of claim 8, wherein said controlled gas environment comprises a vacuum environment to reduce oxidation during bonding of said wafers.

11. The apparatus of claim 1, further comprising one or more support rods that engage said pressure housing and inhibit movement of said pressure housing relative to said base surface when said first volume is pressurized.

12. The apparatus of claim 11, wherein said one or more support rods are formed from polytetrafluoroethylene.

13. The apparatus of claim 1, wherein said pressure housing is coupled to said base surface by a tongue and groove coupling, said tongue formed on said pressure housing and said groove formed on said base surface.

14. The apparatus of claim 13, wherein said tongue and groove coupling further comprises a plurality of dowels that extend laterally through said tongue and walls of said groove, said plurality of dowels distributed circumferentially so as to inhibit movement of said pressure housing relative to said base surface when said first volume is pressurized.

15. The apparatus of claim 1, wherein said microwave mode of operation comprises a single-mode operation.

* * * * *